United States Patent
Makise et al.

(10) Patent No.: US 11,183,433 B2
(45) Date of Patent: Nov. 23, 2021

(54) METHOD OF EVALUATING SILICON LAYER AND A METHOD OF MANUFACTURING SILICON EPITAXIAL WAFER

(71) Applicant: SUMCO CORPORATION, Tokyo (JP)

(72) Inventors: Sayaka Makise, Saga (JP); Shuichi Samata, Saga (JP); Noritomo Mitsugi, Saga (JP); Sumio Miyazaki, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/962,961

(22) PCT Filed: Jan. 18, 2019

(86) PCT No.: PCT/JP2019/001362
§ 371 (c)(1),
(2) Date: Jul. 17, 2020

(87) PCT Pub. No.: WO2019/146505
PCT Pub. Date: Aug. 1, 2019

(65) Prior Publication Data
US 2020/0343149 A1    Oct. 29, 2020

(30) Foreign Application Priority Data
Jan. 24, 2018  (JP) .............................. JP2018-009752

(51) Int. Cl.
*H01L 21/66* (2006.01)
*G01N 27/20* (2006.01)
*H01L 21/02* (2006.01)

(52) U.S. Cl.
CPC ............. *H01L 22/14* (2013.01); *G01N 27/20* (2013.01); *H01L 21/02532* (2013.01)

(58) Field of Classification Search
None
See application file for complete search history.

(56) References Cited

U.S. PATENT DOCUMENTS

| | | | |
|---|---|---|---|
| 2014/0197862 A1 | 7/2014 | Everaert | |
| 2020/0343149 A1* | 10/2020 | Makise | ................ G01N 27/045 |

FOREIGN PATENT DOCUMENTS

| | | |
|---|---|---|
| JP | 2005-223098 | 8/2005 |
| JP | 2007-42950 | 2/2007 |
| JP | 2012-146886 | 8/2012 |
| JP | 2014-146790 | 8/2014 |
| JP | 2017-103275 | 6/2017 |
| KR | 2015-0027711 A1 | 3/2015 |

OTHER PUBLICATIONS

Official Communication issued in International Bureau of WIPO Patent Application No. PCT/JP2019/001362, International Search Report, dated Mar. 5, 2019.
Official Communication issued in International Bureau of WIPO Patent Application No. PCT/JP2019/001362, Written Opinion, dated Mar. 5, 2019.
IPRP for PCT/JP2019/001362, dated Aug. 6, 2020 (w/ translation).
Office Action for KR App. No. 10-2020-7020288, dated Jul. 22, 2021 (w/translation).

* cited by examiner

*Primary Examiner* — Jack S Chen

(74) *Attorney, Agent, or Firm* — Greenblum & Bernstein, P.L.C.

(57) ABSTRACT

Provided is a method of evaluating a silicon layer, including forming an oxide film on a surface of a silicon layer, performing a charging treatment of charging a surface of the formed oxide film to a negative charge, and measuring a resistivity of the silicon layer that has been subjected to the charging treatment by a van der Pauw method.

8 Claims, No Drawings

METHOD OF EVALUATING SILICON LAYER AND A METHOD OF MANUFACTURING SILICON EPITAXIAL WAFER

CROSS-REFERENCE TO RELATED APPLICATIONS

This application claims the benefit of priority to Japanese Patent Application No. 2018-009752 filed on Jan. 24, 2018, which is expressly incorporated herein by reference in its entirety.

TECHNICAL FIELD

The present invention relates to a method of evaluating a silicon layer and a method of manufacturing a silicon epitaxial wafer.

BACKGROUND ART

Various methods are known as a method of measuring a resistivity of a semiconductor wafer (for example, a spreading resistance method described in Japanese Patent Application Publication No. 2005-223098, which is expressly incorporated herein by reference in its entirety, and the like).

SUMMARY OF INVENTION

A silicon epitaxial wafer, which is a kind of semiconductor wafer, has a silicon epitaxial layer on a single crystal silicon substrate. In a silicon epitaxial wafer, the resistivity of the silicon epitaxial layer affects a performance of the wafer. Accordingly, for example, a silicon epitaxial layer is formed on a monitor wafer, the resistivity of this silicon epitaxial layer is measured, and evaluation results obtained therefrom are sometimes used for quality assurance of product wafers or for operational management of an epitaxial growth step. To perform such quality assurance and/or operational management with high reliability, it is desirable that the measurement accuracy be high. Regarding the measurement accuracy, it can be said that the smaller the variation in measurement values (measurement variation), the higher the accuracy. Regarding the measurement variation, it is said that the measurement variation of the spreading resistance method is relatively small among various methods known as methods for measuring a resistivity of a silicon epitaxial wafer. However, the present inventors have speculated that, in the spreading resistance method, as the resistivity of a measurement target increases, variation in contact resistance between a probe and a sample becomes large, and therefore the measurement variation becomes large. Accordingly, the present inventors considered that they should provide a novel evaluation method in which measurement variation is small in measurement of the resistivity of a silicon epitaxial layer having various values of resistivity. In addition, it can be said that the above-mentioned point is also applicable to measurement of the resistivity of various silicon layers.

One aspect of the present invention provides for a novel evaluation method that can reduce measurement variation in measurement of a resistivity of a silicon layer.

One aspect of the present invention relates to a method of evaluating a silicon layer, the method including:
  forming an oxide film on a surface of a silicon layer;
  performing a charging treatment of charging a surface of the formed oxide film to a negative charge; and
  measuring a resistivity of the silicon layer that has been subjected to the charging treatment by a van der Pauw method.

In one embodiment, the charging treatment may be performed by a corona discharge treatment.

In one embodiment, the charging treatment may be performed by a voltage application treatment.

In one embodiment, the silicon layer may be a silicon epitaxial layer included in an evaluation sample having a pn structure.

In one embodiment, the silicon layer may be a high-resistance silicon epitaxial layer having a resistivity measurement value obtained by a spreading resistance method of 200 Ωcm or more.

In one embodiment, the silicon layer may be an active layer included in an SOI (silicon-on-insulator) wafer.

Another aspect of the present invention relates to a method of manufacturing a silicon epitaxial wafer, the method including:
  producing a silicon epitaxial wafer that is a candidate for a product to be shipped;
  evaluating, by the above evaluation method, a silicon epitaxial layer for evaluation which is formed in the same or substantially the same epitaxial growth step as that of a silicon epitaxial layer included in the silicon epitaxial wafer that is a candidate for a product to be shipped; and
  subjecting the silicon epitaxial wafer that is a candidate for a product to be shipped to preparation for shipment as a product in a case where an obtained resistivity of the silicon epitaxial layer for evaluation is within a range allowable for non-defective products.

Another aspect of the present invention relates to a method of manufacturing a silicon epitaxial wafer, the method including:
  forming a silicon epitaxial layer for evaluation under a test epitaxial growth condition;
  evaluating the silicon epitaxial layer for evaluation by the above evaluation method;
  based on an obtained resistivity of the silicon epitaxial layer for evaluation, determining an epitaxial growth condition obtained by modifying the test epitaxial growth condition as an epitaxial growth condition to be used in a product manufacturing step, or determining the test epitaxial growth condition as an epitaxial growth condition to be used in the product manufacturing step; and
  manufacturing a silicon epitaxial wafer for product shipment by the product manufacturing step including an epitaxial growth step performed under the determined epitaxial growth condition.

According to one aspect of the present invention, it is possible to provide a method of evaluating a silicon layer which is a novel evaluation method that can reduce measurement variation in measurement of a resistivity of a silicon layer.

DESCRIPTION OF EMBODIMENTS

[Method of Evaluating Silicon Layer]

One aspect of the present invention relates to a method of evaluating a silicon layer (hereinafter, simply referred to as the "evaluation method"), the method including forming an oxide film on a surface of a silicon layer, performing a charging treatment of charging a surface of the formed oxide film to a negative charge, and measuring a resistivity of the silicon layer that has been subjected to the charging treatment by a van der Pauw method.

The van der Pauw method is a known method as a method of evaluating physical properties such as the resistivity and Hall coefficient of a semiconductor sample. The present inventors considered that improvement in measurement accuracy could be expected in the van der Pauw method as compared to a method in which measurement was performed only at one location (for example, a known four probe method as a method of measuring the resistivity and the like of a semiconductor sample), because the van der Pauw method is a method in which electrodes are provided at four locations on a surface of a sample, measurement such as voltage measurement is performed at multiple locations, and measurement results are obtained by averaging obtained values. In addition, the present inventors considered that since the van der Pauw method used a film-like sample as a model, accurate measurement can be performed on a thin film such as a silicon epitaxial layer of a silicon epitaxial wafer, for example.

Due to the above reasons, the present inventors have adopted the van der Pauw method for resistivity measurement of a silicon layer. The present inventors have further conducted extensive research and have newly found that it is possible to reduce measurement variation in resistivity measurement of a silicon layer by performing oxide film formation and a charging treatment of charging a surface of an oxide film to a negative charge as pretreatments for resistivity measurement by the van der Pauw method, and thereby they have completed the evaluation method.

Hereinafter, the above evaluation method will be described in more detail.

<Evaluation Target>

An evaluation target of the evaluation method is a silicon layer. The silicon layer may be a single crystal silicon layer, or may be a silicon epitaxial layer in one embodiment. The silicon epitaxial layer can be produced by epitaxially growing a p-type or n-type single crystal silicon film. Known techniques can be applied to formation of the silicon epitaxial layer by epitaxial growth. The conductivity type of the silicon epitaxial layer can be controlled by the type of dopant, and a resistivity of the silicon epitaxial layer can be controlled by a concentration of dopant.

In the evaluation of the silicon epitaxial layer, it is preferable to measure a resistivity of a silicon epitaxial layer included in an evaluation sample having a pn structure by the van der Pauw method to inhibit current leakage to a portion located on a layer below the silicon epitaxial layer during resistivity measurement.

Regarding the pn structure, it is possible to produce an evaluation sample having a pn structure by forming an n-type silicon epitaxial layer on a p-type semiconductor substrate. Alternatively, it is possible to produce an evaluation sample having a pn structure by forming a p-type silicon epitaxial layer on an n-type semiconductor substrate. In the pn structure, it is possible to electrically separate the silicon epitaxial layer from a portion (a substrate) located as a layer below the silicon epitaxial layer using a depletion layer of a pn junction. A built-in potential decreases when a resistivity of the silicon epitaxial layer increases, followed by an increase of a width of the depletion layer, and thereby a potential gradient may become small. In such a case, it is possible to further inhibit current leakage to a portion (a substrate) located as a layer below the silicon epitaxial layer by applying a reverse voltage of the pn junction to the substrate side to increase the built-in potential. Known techniques can be applied for the application of a reverse voltage.

The silicon epitaxial layer to be evaluated is preferably a high-resistance silicon epitaxial layer having a resistivity measurement value obtained by a spreading resistance method of 200 Ωcm or more. Measurement values obtained by a spreading resistance method in the present invention and the present specification are values obtained by measurement by a known spreading resistance method. According to the spreading resistance method, it is possible to perform measurement on a silicon epitaxial layer having a resistivity of 200 Ωcm or more, and it is possible to make measurement variation relatively small as compared with other resistivity measuring methods. However, as described above, the present inventors speculate that, in the spreading resistance method, as a resistivity of an evaluation target becomes large, contact variation between a probe and a sample becomes large, and as a result, measurement variation becomes large. In contrast, according to the above evaluation method, it is possible to evaluate a high-resistance silicon epitaxial layer having a resistivity measurement value obtained by a spreading resistance method of 200 Ωcm or more, with reduced measurement variation in resistivity measurement. The silicon epitaxial layer to be evaluated may have a resistivity measurement value of 300 Ωcm or more, 400 Ωcm or more, or 500 Ωcm or more which are obtained by the spreading resistance method. In addition, although the silicon epitaxial layer to be evaluated may have, for example, a resistivity measurement value obtained by a spreading resistance method of 1000 Ωcm or less, according to the above evaluation method, it is possible to reduce measurement variation in resistivity measurement even in a case of a silicon epitaxial layer having a resistivity measurement value exceeding the above value.

In addition, in one embodiment, the silicon layer to be evaluated by the above evaluation method may be an active layer of an SOI wafer including a single crystal silicon substrate, an insulating film (for example, an oxide film), and a silicon layer (called an active layer) in this order. Because the SOI wafer includes an insulating film, it is possible to inhibit current leakage to a portion located as a layer below the silicon layer during resistivity measurement.

The active layer to be evaluated is preferably a high-resistance silicon layer having a resistivity measurement value obtained by a spreading resistance method of 200 Ωcm or more. As described above, the present inventors speculate that, in the spreading resistance method, as a resistivity of an evaluation target becomes large, contact variation between a probe and a sample becomes large, and as a result, measurement variation becomes large. On the other hand, according to the above evaluation method, it is possible to evaluate a high-resistance silicon layer having a resistivity measurement value obtained by a spreading resistance method of 200 Ωcm or more, with reduced measurement variation in resistivity measurement. The silicon layer to be evaluated may have a resistivity measurement value of 300 Ωcm or more, 400 Ωcm or more, or 500 Ωcm or more which are obtained by the spreading resistance method. In addition, although the silicon layer to be evaluated may have, for example, a resistivity measurement value obtained by a spreading resistance method of 1000 Ωcm or less, according to the above evaluation method, it is possible to reduce measurement variation in resistivity measurement even in a case of a silicon layer showing a resistivity measurement value exceeding the above value.

Known techniques can be applied to production of the SOI wafer. The conductivity type of the active layer can be controlled by the type of dopant, and a resistivity of the active layer can be controlled by a concentration of dopant.

<Pretreatments for Resistivity Measurement>

In the above evaluation method, the oxide film formation and charging treatment are performed as pretreatments before resistivity measurement is performed by the van der Pauw method. These pretreatments will be described in more detail below.

(Oxide Film Formation)

As a pretreatment for resistivity measurement, first, an oxide film is formed on a surface of the silicon layer to be evaluated. The "oxide film" referred to in the present invention and the present specification is a silicon oxide film (for example, a $SiO_2$ film). In some cases, although a natural oxide film may be formed on the surface of the silicon layer, it is considered difficult to sufficiently reduce measurement variation in a natural oxide film because an amount of negative charge retained by charging treatment to be described later is small. Accordingly, in the above evaluation method, an oxide film is formed before the charging treatment. A thickness of the oxide film on the surface of the silicon layer is preferably more than a thickness of the natural oxide film, and from this viewpoint, it is preferably 1 nm or more. A thickness of the oxide film refers to a total thickness of the natural oxide film and the oxide film formed by oxide film formation in a case where the oxide film formation is performed without subjecting a silicon epitaxial layer on which a natural oxide film is present to a process of removing the natural oxide film. In addition, a thickness of the oxide film on the surface of the silicon layer may be, for example, 20 nm or less.

The oxide film formation may be performed by a wet-type oxidation which is an oxidation treatment performed using a treatment liquid, or may be performed by a dry-type oxidation which is an oxidation treatment performed without using a treatment liquid. The dry-type oxidation is preferable from the viewpoint of simplicity of an oxidation treatment and the like. The dry-type oxidation can be performed by a known method such as a thermal oxidation or a plasma treatment, and a thermal oxidation is preferable. The thermal oxidation can be performed by disposing an evaluation sample including a silicon layer to be evaluated in a heated oxidizing atmosphere. The oxidizing atmosphere is an atmosphere containing at least an oxidizing gas, and it may be, for example, an atmosphere containing 10% by volume to 100% by volume of oxygen. An atmospheric temperature of the oxidizing atmosphere may be, for example, 700° C. to 1300° C., and a heating time may be, for example, 1 minute to 1000 minutes. However, the above-mentioned thermal oxidation conditions are examples, and conditions are not limited thereto.

(Charging Treatment)

In the above evaluation method, the charging treatment of charging a surface of a formed oxide film to a negative charge is performed. Generally in the van der Pauw method, electrodes are installed at four corners of a square on a surface of a sample on which electrodes are formed, a voltage is applied between two adjacent electrodes, and the applied voltage is measured by the remaining two electrodes. It is preferable to adjust a shape of the sample to a shape suitable for measurement by the van der Pauw method prior to the charging treatment. In addition, it is preferable to install electrodes used for measurement by the van der Pauw method (hereinafter, referred to as the "electrodes for measurement") prior to the charging treatment. The electrodes for measurement can be formed by a known method. As the electrodes for measurement, metal electrodes having favorable ohmic properties with respect to a silicon layer to be evaluated are preferable. From this viewpoint, as the electrodes for measurement, metal (for example, Mg) electrodes having a work function of 3.7 eV or less are preferable in a case where a silicon layer to be evaluated is of an n-type, and metal (for example, Au) electrodes having a work function of more than 3.7 eV are preferable in a case where a silicon layer to be evaluated is of a p-type.

The charging treatment in the above evaluation method is a treatment of charging a surface of the oxide film on the surface of the silicon layer to a negative charge. The oxide film has a positive charge, and in a case where it is not charged to a negative charge, it is thought that an accumulation layer (in a case where the silicon layer is of an n-type) or an inversion layer (in a case where the silicon layer is of a p-type) is formed in a region on the oxide film side of the silicon layer. It is speculated that an influence thereof in the above-mentioned case becomes larger as resistance increases, and a cause of measurement variation. On the other hand, by charging the surface of the oxide film to a negative charge, it is thought that formation of an accumulation layer can be inhibited in the case of an n-type, and formation of an inversion layer can be inhibited in the case of a p-type. Accordingly, the present inventors speculate that it is possible to reduce measurement variation in resistivity measurement by the van der Pauw method.

As one embodiment of the charging treatment, a treatment of depositing negative charges on the surface of the oxide film can be exemplified. Examples of such a treatment include a corona discharge treatment. The surface of the oxide film can be charged to a negative charge by generating negative ions by corona discharge.

As the number of times of corona discharge treatment increases, more negative charges can be deposited on the surface of the oxide film. When more negative charges are deposited, this is preferable from the viewpoint of further reducing measurement variation. Meanwhile, as an amount of negative charge deposited on the surface of the oxide film increases, a resistivity value obtained by measurement tends to increase. The reason for this is thought to be that, as an amount of negative charge deposited on the surface of the oxide film increases, an inversion layer (in a case where the silicon layer is of an n-type) or an accumulation layer (in a case where the silicon layer is of a p-type) is formed in a region on the oxide film side of the silicon layer. In such a case, for example, it is possible to perform a preliminary experiment to determine a correction formula in advance, and to adopt a value obtained by correcting a resistivity value obtained by measurement using the correction formula as a resistivity used for evaluating a silicon layer. However, for example, it is possible to set an allowable range of a resistivity obtained under certain charging treatment conditions in advance, and perform evaluation of a silicon layer based on whether or not a resistivity obtained under the charging treatment conditions is within the allowable range. Accordingly, it is possible to sufficiently perform evaluation of the silicon layer even when there is a tendency of a resistivity value obtained by measurement to increase or decrease.

The number of times of corona discharge treatment is preferably one or more from the viewpoint of reducing measurement variation. The number of times thereof is preferably five or less, more preferably four or less, and even more preferably three or less from the viewpoint of preventing dielectric breakdown of the oxide film. In addition, as described above, it is considered preferable to inhibit formation of an accumulation layer (in a case where the silicon layer is of an n-type) or an inversion layer (in a case where the silicon layer is of a p-type) from the viewpoint of reducing measurement variation; and it is considered preferable to inhibit formation of an inversion layer (in a case where the silicon layer is of an n-type) or an accumulation layer (in a case where the silicon layer is of a p-type) from the viewpoint of inhibiting an increase in resistivity values obtained by measurement. That is, the silicon layer is preferably in a flat band state or a state close to a flat band state, and is more preferably in a flat band state in order to be able to reduce measurement variation while inhibiting an increase in resistivity measurement values. From this viewpoint, the number of times of corona discharge treatment is preferably within a range of one to three times, is more preferably one or two times, and is most preferably one time. In addition, from the above viewpoint, a total charge amount per unit area of the corona discharge treatment is preferably $-1.0 \times 10^{12}$ charges/cm$^2$ or less, and is more preferably $-3.0 \times 10^{11}$ to $-8.5 \times 10^{11}$ charges/cm$^2$.

In addition, as another embodiment of the charging treatment, a voltage application treatment can be exemplified. The voltage application treatment can be performed by, for example, disposing electrodes on a surface of the oxide film and applying a voltage between the electrodes and a back surface of a wafer (for example, a substrate side in a pn structure). The surface of the oxide film can be charged to a negative charge by applying a voltage such that a negative voltage is applied to the oxide film. An absolute value of the applied voltage is preferably one-tenth or more of a flat band voltage of the silicon layer from the viewpoint of inhibiting formation of an accumulation layer (in a case where the silicon layer is of an n-type) or an inversion layer (in a case where the silicon layer is of a p-type) and reducing measurement variation. In addition, an absolute value of the applied voltage is preferably lower than a dielectric breakdown voltage of the oxide film from the viewpoint of preventing dielectric breakdown of the oxide film. Furthermore, as described above regarding the corona discharge treatment, the silicon layer is preferably in a flat band state or a state close to a flat band state, and is more preferably in a flat band state. The flat band voltage of the silicon layer can be obtained by CV (capacitance-voltage) measurement. Accordingly, for example, voltage application conditions can be determined based on a flat band voltage obtained by performing CV measurement on the silicon layer to be evaluated or performing CV measurement on a silicon layer formed under the same conditions as the silicon layer to be evaluated.

<Resistivity Measurement by Van Der Pauw Method>

In the above evaluation method, a resistivity of the silicon layer is measured by the van der Pauw method after the above-described charging treatment. A method of measuring a resistivity by the van der Pauw method is known, and in the above evaluation method, a resistivity can be measured by the van der Pauw method according to a known method. For example, it is possible to reduce measurement variation by performing the oxide film formation and the charging treatment as the pretreatments in a case of performing measurement of the same silicon layer multiple times by the van der Pauw method, as compared with measurement performed without the oxide film formation and/or the charging treatment. In addition, low measurement variation means that the measurement accuracy is high, and obtained measurement results are highly reliable. Therefore, according to the method capable of reducing measurement variation, highly reliable measured values can be obtained as measured values obtained by one measurement.

In the above evaluation method, as evaluation indices of the silicon layer to be evaluated, values obtained by one resistivity measurement may be used, or a representative value (for example, an arithmetic average, a minimum value, a maximum value, or the like) of measurement values obtained by multiple measurements may be used.

[Method of Manufacturing Silicon Epitaxial Wafer]

A method of manufacturing a silicon epitaxial wafer according to one aspect of the present invention is a method of manufacturing a silicon epitaxial wafer (hereinafter referred to as the "first manufacturing method"), the method including:

producing a silicon epitaxial wafer that is a candidate for a product to be shipped;

evaluating, by the above evaluation method, a silicon epitaxial layer for evaluation which is formed in the same or substantially the same epitaxial growth step as that of a silicon epitaxial layer included in the silicon epitaxial wafer that is a candidate for a product to be shipped; and subjecting the silicon epitaxial wafer that is a candidate for a product to be shipped to preparation for shipment as a product in a case where an obtained resistivity of the silicon epitaxial layer for evaluation is within a range allowable for non-defective products.

A method of manufacturing a silicon epitaxial wafer according to another aspect of the present invention is a method of manufacturing a silicon epitaxial wafer (hereinafter referred to as the "second manufacturing method"), the method including:

forming a silicon epitaxial layer for evaluation under a test epitaxial growth condition;

evaluating the silicon epitaxial layer for evaluation by the above evaluation method;

based on an obtained resistivity of the silicon epitaxial layer for evaluation, determining an epitaxial growth condition obtained by modifying the test epitaxial growth condition as an epitaxial growth condition to be used in a product manufacturing step, or determining the test epitaxial growth condition as an epitaxial growth condition to be used in the product manufacturing step; and manufacturing a silicon epitaxial wafer for product shipment by the product manufacturing step including an epitaxial growth step performed under the determined epitaxial growth condition.

The first manufacturing method can be said to be a method using the evaluation results from the above evaluation method of quality assurance of a silicon epitaxial wafer to be shipped as a product. In addition, the second manufacturing method can be said to be a method using the evaluation results from the above evaluation method of so-called operational management. In both methods, evaluation is performed by the evaluation method according to one aspect of the present invention described above.

Hereinafter, the first manufacturing method and the second manufacturing method will be described in more detail.

<First Manufacturing Method>

(Production of Silicon Epitaxial Wafer that is Candidate for Product to be Shipped)

The production of a silicon epitaxial wafer that is a candidate for a product to be shipped in the first manufacturing method can be performed by a known step of manufacturing a silicon epitaxial wafer. Generally, a silicon epitaxial wafer is produced by disposing a single crystal silicon wafer such as a polished wafer in an epitaxial growth furnace, and epitaxially growing (vapor-phase growth) a single crystal silicon film on a surface of the polished wafer to form a silicon epitaxial layer. The conductivity type of the silicon epitaxial layer can be controlled by the type of dopant, and a resistivity can be controlled by a concentration of dopant. A silicon epitaxial layer containing a dopant can be formed by mixing a source gas of the dopant with a gas for vapor phase growth. In the first manufacturing method, whether or not the silicon epitaxial layer included in the silicon epitaxial wafer that is a candidate for a product to be shipped has a resistivity level of non-defective products is determined based on results of evaluating a resistivity of the silicon epitaxial layer for evaluation by the above evaluation method.

(Formation and Evaluation of Silicon Epitaxial Layer for Evaluation)

The silicon epitaxial layer for evaluation is a silicon epitaxial layer formed in the same or substantially the same epitaxial growth step as that of a silicon epitaxial layer included in the silicon epitaxial wafer that is a candidate for a product to be shipped. The term "same epitaxial growth step" refers to an epitaxial growth step performed in the same epitaxial growth furnace under the same epitaxial growth conditions as those of the silicon epitaxial layer of the silicon epitaxial wafer that is a candidate for a product to be shipped. The term "substantially the same epitaxial growth step" refers to an epitaxial growth step performed in the same epitaxial growth furnace under the same epitaxial growth conditions except for a time for performing epitaxial growth (a treatment time) as those of the silicon epitaxial layer of the silicon epitaxial wafer that is a candidate for a product to be shipped. Regarding "the same epitaxial growth furnace," either one of formation of the silicon epitaxial layer of the silicon epitaxial wafer that is a candidate for a product to be shipped, and formation of the silicon epitaxial layer for evaluation may be performed first, but maintenance management of the furnace is not performed between them. In addition, examples of epitaxial growth conditions include the type of a gas for vapor phase growth, a flow rate, a mixing ratio, a treatment time, and the like. Regarding "the same epitaxial growth conditions," changes that may generally occur due to a device or the like are allowed. The single crystal silicon substrate on which the silicon epitaxial layer for evaluation is grown does not need to be the same single crystal silicon wafer as the silicon epitaxial wafer that is a candidate for a product to be shipped. It is preferable to select a substrate such that an evaluation sample having a pn structure can be produced as described above. The evaluation sample thus obtained is evaluated by the evaluation method according to one aspect of the present invention. The details of the evaluation are as described above.

(Pass or Fail Determination)

In the first manufacturing method, a resistivity obtained for the silicon epitaxial layer for evaluation is used to determine whether or not a silicon epitaxial wafer that is a candidate for a product to be shipped has a resistivity required for a product (pass or fail determination). A resistivity used for the pass or fail determination may be a value obtained by one measurement for one silicon epitaxial layer for evaluation, or may be a representative value (for example, an arithmetic average, a minimum value, a maximum value, and the like) of measurement values from multiple measurements which are obtained for one silicon epitaxial layer for evaluation. Alternatively, a resistivity of plurality of silicon epitaxial layers for evaluation may be measured by the above evaluation method, and a representative value (for example, an arithmetic average, a minimum value, a maximum value, and the like) of the measurement values may be used for pass or fail determination. The pass or fail determination is performed based on whether or not a resistivity is within a range allowable for non-defective products. The range allowable for non-defective products may be determined according to the quality required for a product wafer. A silicon epitaxial wafer that is a candidate for a product to be shipped is subject to preparation for shipment as a product in a case where a resistivity is within the range allowable for non-defective products. The preparation for shipment as a product includes, for example, packing and the like. As described above, according to the first manufacturing method, it is possible to stably supply a silicon epitaxial wafer having a resistivity required for a product wafer to the market. On the other hand, a silicon epitaxial wafer that is a candidate for a product to be shipped is not subjected to preparation for shipment as an intended product in a case where a resistivity is beyond the range allowable for non-defective products. In this case, the silicon epitaxial wafer that is a candidate for a product to be shipped may be subjected to preparation for shipment as a product of another grade, or may be discarded, for example.

<Second Manufacturing Method>

In the second manufacturing method, the evaluation results obtained by the above evaluation method are used to determine an epitaxial growth condition to be adopted in a product manufacturing step. Details will be described below.

(Formation and Evaluation of Silicon Epitaxial Layer for Evaluation)

"Test epitaxial growth condition" is an epitaxial growth condition that is a candidate for an epitaxial growth condition to be employed in a product manufacturing step. A silicon epitaxial layer for evaluation is formed under such epitaxial growth condition. The test epitaxial growth condition may include the type of gas for vapor phase growth, a flow rate, a mixing ratio, a treatment time, the type of epitaxial growth furnace used, the type of members used in the epitaxial growth furnace, and the like.

As in the case of the silicon epitaxial layer for evaluation in the first manufacturing method, the silicon epitaxial layer for evaluation may be formed on a single crystal silicon substrate, and a substrate is preferably selected such that an evaluation sample having a pn structure can be produced. The evaluation sample thus obtained is evaluated by the evaluation method according to one aspect of the present invention. The details of the evaluation are as described above.

(Determination of Epitaxial Growth Condition to be Used in Product Manufacturing Step)

In the second manufacturing method, epitaxial growth conditions to be employed in a product manufacturing step are determined using a resistivity obtained for the silicon epitaxial layer for evaluation. A resistivity used for this determination may be a measurement value obtained by one measurement for one silicon epitaxial layer for evaluation, or may be a representative value (for example, an arithmetic average, a minimum value, a maximum value, and the like) of measurement values from multiple measurements which are obtained for one silicon epitaxial layer for evaluation. Alternatively, a resistivity of plurality of silicon epitaxial layers for evaluation may be measured by the above evaluation method, and a representative value (for example, an arithmetic average, a minimum value, a maximum value, and the like) of the measurement values may be used. The determination of epitaxial growth condition to be used in a product manufacturing step may be performed based on whether or not a resistivity determined for the silicon epitaxial layer for evaluation is within a range allowable for non-defective products. As in the case of the first manufacturing method, the range allowable for non-defective products may be determined according to quality required for a product wafer. It is possible to adopt the test epitaxial growth condition under which the silicon epitaxial layer for evaluation is formed for epitaxial growth condition to be used in a product manufacturing step in a case where a resistivity is within a range allowable for non-defective products. The epitaxial growth condition determined in this manner is adopted in a product manufacturing step, and a step of forming a silicon epitaxial layer under this epitaxial growth condition is performed to ship a product silicon epitaxial wafer. Thereby, it is possible to stably supply a silicon epitaxial wafer having a resistivity required for a product wafer to the market.

On the other hand, the epitaxial growth condition obtained by modifying the test epitaxial growth condition is determined as the epitaxial growth condition to be used in a product manufacturing step in a case where a resistivity obtained for the silicon epitaxial layer for evaluation is beyond the range allowable for non-defective products. It is preferable that the condition to be modified is the condition that is considered to affect a resistivity. Examples of such condition include a flow rate of a source gas of a dopant, and the like. The epitaxial growth condition obtained in this manner by modifying the test epitaxial growth condition is adopted in a product manufacturing step, and a step of forming a silicon epitaxial layer under this epitaxial growth condition is performed to ship a product silicon epitaxial wafer. Thereby, it is possible to stably supply a silicon epitaxial wafer having a resistivity required for a product wafer to the market. The following may be repeated one time or more: a silicon epitaxial layer for evaluation is formed again under the condition obtained by modifying the test epitaxial growth condition, this silicon epitaxial layer for evaluation is evaluated by the evaluation method according to one aspect of the present invention, and whether to adopt this condition in a product manufacturing step or to further modify this condition is determined.

It is possible to apply a known technique regarding manufacture of a silicon epitaxial wafer for other details of the first manufacturing method and the second manufacturing method.

EXAMPLES

Hereinafter, the present invention will be further described based on examples. However, the present invention is not limited to embodiments shown in the examples.

[Examples 1 to 3 and Comparative Examples 1 to 4]

1. Production of evaluation sample

A plurality of evaluation samples each having an n-type silicon epitaxial layer (having a thickness of 60 to 90 μm) were produced, and the layer had a resistivity measurement value of about 1000 Ωcm or about 500 Ωcm which was obtained by a spreading resistance method. The produced evaluation sample was an n/p-silicon epitaxial wafer having a pn structure in which the above-mentioned n-type silicon epitaxial layer was formed on a single-crystal p-type silicon wafer having a resistivity measurement value of about 15 Ωcm which was obtained by the spreading resistance method.

2. Formation of Oxide Film

An oxide film was formed on a surface of the silicon epitaxial layer of some of the plurality of evaluation samples. The formation of the oxide film was performed in a furnace for a thermal oxidation (100% oxygen atmosphere, furnace atmospheric temperature: 900° C., treatment time: 11 minutes 10 seconds, formation of an oxide film having a thickness of about 7 nm).

3. Cleavage of Sample and Installation of Electrodes for Measurement

All evaluation samples were respectively cleaved into a size of 5 mm×5 mm to 10 mm×10 mm for measurement by a van der Pauw method.

Thereafter, an oxide film on a portion at which an electrode for evaluation was to be installed and around the portion was removed from the evaluation samples of the above section 2 on which the oxide film was formed.

All the evaluation samples were introduced into high-vacuum deposition equipment after a mask was installed on a surface on the silicon epitaxial layer side, and Mg was vacuum deposited (formation of an Mg electrode) in the equipment. In this manner, one electrode for measurement (the Mg electrode) was formed at each of four corners of the surface on the silicon epitaxial layer side.

4. Charging Treatment

The electrodes for measurement of the above section 3 were installed on some of the evaluation samples of the above section 2 on which the oxide film was formed, and then a surface of the oxide film was charged to a negative charge by the corona discharge treatment (one or three times). One scan with a corona wire was defined as one corona discharge treatment. A total charge amount per unit area by one or three times of the corona discharge treatment was within a range of $-3.0 \times 10^{11}$ to $-8.5 \times 10^{11}$ charges/cm$^2$.

5. Resistivity Measurement by Van Der Pauw Method

Resistivity measurement was performed on the silicon epitaxial layer of all of the above-mentioned evaluation samples by the van der Pauw method. In the measurement by the van der Pauw method, a voltage applied by flowing a current between two adjacent electrodes among four electrodes for measurement was measured by the remaining two electrodes. This voltage measurement was performed twice while changing a combination of the electrodes, and a resistivity was obtained using an arithmetic average of the obtained measurement values.

According to number of times shown in Table 1 or Table 2, the above-described resistivity measurement by the van der Pauw method was performed on each of the evaluation samples.

The results obtained by the above-described measurements are shown in Table 1 or Table 2. Table 1 shows evaluation results of an evaluation sample having a silicon epitaxial layer of which a resistivity measurement value obtained by the spreading resistance method was about 1000 Ωcm. Table 2 shows evaluation results of an evaluation sample having a silicon epitaxial layer of which a resistivity measurement value obtained by the spreading resistance method was about 500 Ωcm.

in the production of the evaluation samples of Examples 1 and 2, except that the electrodes for measurement of the above 3 were installed, and then a polysilicon film was deposited on a surface of an oxide film by a CVD (chemical vapor deposition) method, and thereafter, patterning was

TABLE 1

| | Pretreatments for resistivity measurement | | | Measurement results | | | | |
|---|---|---|---|---|---|---|---|---|
| | | | | | RANGE (maximum | | STDEV | |
| | Formation of oxide film | Charging treatment | Number of resistivity measurements | Resistivity measurement AVE (arithmetic average) [Ω cm] | value-minimum value) [Ω cm] | (RANGE/AVE) × 100 | (standard deviation) | STDEV/AVE |
| Example 1 | Performed | Corona discharge treatment Three times | 4 | 2788 | 285 | 10% | 138 | 5% |
| Example 2 | Performed | Corona discharge treatment Once | 4 | 1000 | 290 | 29% | 134 | 13% |
| Comparative Example 1 | Performed | Not performed | 4 | 563 | 376 | 67% | 166 | 29% |
| Comparative Example 2 | Not performed | Not performed | 6 | 710 | 508 | 72% | 195 | 27% |

TABLE 2

| | Pretreatments for resistivity measurement | | | Measurement results | | | | |
|---|---|---|---|---|---|---|---|---|
| | | | | | RANGE (maximum | | STDEV | |
| | Formation of oxide film | Charging treatment | Number of resistivity measurements | Resistivity measurement AVE (arithmetic average) [Ω cm] | value-minimum value) [Ω cm] | (RANGE/AVE) × 100 | (standard deviation) | STDEV/AVE |
| Example 3 | Performed | Corona discharge treatment Once | 4 | 393 | 19 | 5% | 13 | 3% |
| Comparative Example 3 | Performed | Not performed | 4 | 388 | 56 | 14% | 39 | 10% |
| Comparative Example 4 | Not performed | Not performed | 4 | 412 | 95 | 23% | 50 | 12% |

"(RANGE/AVE)×100" and "STDEV/AVE" in Table 1 or Table 2 are indices of measurement variation, and mean that the smaller the value thereof, the smaller the measurement variation. Based on the results shown in Table 1 or Table 2, it could be confirmed that measurement variation was reduced in Examples 1 and 2 in which the oxide film formation and the charging treatment were performed as the pretreatments for resistivity measurement by the van der Pauw method, compared to Comparative Examples 1 and 2; and that measurement variation was reduced in Example 3 in which the oxide film formation and the charging treatment were performed as the pretreatments, compared to Comparative Examples 3 and 4.

Example 4

Examples 1 to 3 are examples in which the charging treatment performed after the oxide film formation was performed by the corona discharge treatment.

In contrast, in Example 4, the charging treatment was performed by a voltage application treatment. Production of an evaluation sample was performed in the same manner as in the production of the evaluation samples of Examples 1 and 2, except that the electrodes for measurement of the above 3 were installed, and then a polysilicon film was deposited on a surface of an oxide film by a CVD (chemical vapor deposition) method, and thereafter, patterning was performed by a photolithography method to form a polysilicon electrode on the oxide film, and except that an Al electrode was formed on the entire back surface of a wafer. The charging treatment of the produced production sample was performed by applying a voltage between the formed polysilicon electrode and the Al electrode such that a negative voltage was applied to the oxide film. CV measurement was performed on a silicon epitaxial layer formed in the same silicon epitaxial growth step as that of a silicon epitaxial layer included in the measurement sample of Example 4 to obtain a flat band voltage, which was −0.48 V. In addition, a dielectric breakdown voltage of the oxide film of the silicon epitaxial layer of the above section 2 in which the oxide film had been formed could be estimated to be about 10 V based on known dielectric breakdown characteristics of oxides (a silicon oxide) and a thickness of the oxide film. Three levels of negative voltages, which were −0.40 V, −0.50 V, or −0.60 V as applied voltages, were applied to different evaluation samples in consideration of the flat band voltage and the dielectric breakdown voltage.

Resistivity measurement was performed one time by the van der Pauw method on the silicon epitaxial layer of the above-mentioned evaluation samples that had been subjected to the voltage application. Table 3 shows the measurement results.

TABLE 3

| Application voltage in charging treatment | Resistivity measurement value by van der Pauw method [Ωcm] |
|---|---|
| −0.60 V | 1750 |
| −0.50 V | 1000 |
| −0.40 V | 800 |

When the results of Table 1 were compared with the results of Table 3, the similar resistivity measurement value to that of Example 2 was obtained in the case where the treatment of applying a voltage of −0.50 V or −0.40 V was performed. Therefore, it can be said that the application of a voltage of −0.50 V to −0.40 V can apply the similar level of negative charge to a surface of an oxide film to that of the charging treatment of about one corona charge. In addition, resistivity measurement values within the range from the resistivity obtained in Example 2 to the resistivity obtained in Example 1 were obtained in the case where the treatment of applying a voltage of −0.60 V was performed. Therefore, it can be said that the application of a voltage of −0.60 V can apply the similar level of negative charge to a surface of an oxide film to that of the charging treatment of about two times of corona charge.

Furthermore, as shown in Table 1, measurement variation was reduced, that is, measurement was possible with high accuracy in the case where the charging treatment of one to three times of corona charge was performed after forming the oxide film as the pretreatment. Therefore, it can be said that the measurement results shown in Table 3, which were obtained by performing measurement after applying the similar level of negative charge to that of the case of Table 1 to a surface of the oxide film, are also result obtained by measurement with high accuracy.

The resistivity obtained by the evaluation in Examples 1 to 4 can be used for quality assurance of a product wafer and/or operational management as described above in detail.

Each of the above aspects is useful in the technical field of semiconductor wafers.

The invention claimed is:

1. A method of evaluating a silicon layer, the method comprising:
   forming an oxide film on a surface of a silicon layer;
   performing a charging treatment of charging a surface of the formed oxide film to a negative charge; and
   measuring a resistivity of the silicon layer that has been subjected to the charging treatment by a van der Pauw method.

2. The method of evaluating a silicon layer according to claim 1,
   wherein the charging treatment is performed by a corona discharge treatment.

3. The method of evaluating a silicon layer according to claim 1,
   wherein the charging treatment is performed by a voltage application treatment.

4. The method of evaluating a silicon layer according to claim 1,
   wherein the silicon layer is a silicon epitaxial layer included in an evaluation sample having a pn structure.

5. The method of evaluating a silicon layer according to claim 1,
   wherein the silicon layer is a high-resistance silicon epitaxial layer having a resistivity measurement value obtained by a spreading resistance method of 200 Ωcm or more.

6. The method of evaluating a silicon layer according to claim 1,
   wherein the silicon layer may be an active layer included in an SOI wafer.

7. A method of manufacturing a silicon epitaxial wafer, the method comprising:
   producing a silicon epitaxial wafer that is a candidate for a product to be shipped;
   evaluating, by the evaluation method according to any of claim 1, a silicon epitaxial layer for evaluation which is formed in the same or substantially the same epitaxial growth step as that of a silicon epitaxial layer included in the silicon epitaxial wafer that is a candidate for a product to be shipped; and
   subjecting the silicon epitaxial wafer that is a candidate for a product to be shipped to preparation for shipment as a product in a case where an obtained resistivity of the silicon epitaxial layer for evaluation is within a range allowable for non-defective products.

8. A method of manufacturing a silicon epitaxial wafer, the method comprising:
   forming a silicon epitaxial layer for evaluation under a test epitaxial growth condition;
   evaluating the silicon epitaxial layer for evaluation by the evaluation method according to any of claim 1;
   based on an obtained resistivity of the silicon epitaxial layer for evaluation, determining an epitaxial growth condition obtained by modifying the test epitaxial growth condition as an epitaxial growth condition to be used in a product manufacturing step, or determining the test epitaxial growth condition as an epitaxial growth condition to be used in the product manufacturing step; and
   manufacturing a silicon epitaxial wafer for product shipment by the product manufacturing step including an epitaxial growth step performed under the determined epitaxial growth condition.

* * * * *

UNITED STATES PATENT AND TRADEMARK OFFICE
CERTIFICATE OF CORRECTION

PATENT NO. : 11,183,433 B2
APPLICATION NO. : 16/962961
DATED : November 23, 2021
INVENTOR(S) : Makise et al.

It is certified that error appears in the above-identified patent and that said Letters Patent is hereby corrected as shown below:

In the Claims

At Column 16, Line 25 (Claim 7), please change "according to any of" to -- according --.

Signed and Sealed this
Twenty-fourth Day of May, 2022

*Katherine Kelly Vidal*

Katherine Kelly Vidal
*Director of the United States Patent and Trademark Office*